(12) United States Patent
Nishi et al.

(10) Patent No.: US 10,281,530 B2
(45) Date of Patent: May 7, 2019

(54) BATTERY CAPACITY MEASURING DEVICE AND BATTERY CAPACITY MEASURING METHOD

(71) Applicant: PRIMEARTH EV ENERGY CO., LTD., Kosai-shi, Shizuoka (JP)

(72) Inventors: Hiroki Nishi, Kosai (JP); Daisuke Koba, Toyohashi (JP); Tetsuya Osaka, Tokyo (JP)

(73) Assignee: PRIMEARTH EV ENERGY CO., LTD., Kosai-Shi (JP)

( * ) Notice: Subject to any disclaimer, the term of this patent is extended or adjusted under 35 U.S.C. 154(b) by 106 days.

(21) Appl. No.: 15/693,381

(22) Filed: Aug. 31, 2017

(65) Prior Publication Data

US 2018/0067169 A1    Mar. 8, 2018

(30) Foreign Application Priority Data

Sep. 6, 2016 (JP) ................................ 2016-173725

(51) Int. Cl.
| G01R 31/389 | (2019.01) |
| G01R 31/367 | (2019.01) |
| H01M 10/48 | (2006.01) |
| H01M 10/34 | (2006.01) |

(52) U.S. Cl.
CPC ......... *G01R 31/389* (2019.01); *G01R 31/367* (2019.01); *H01M 10/345* (2013.01); *H01M 10/48* (2013.01)

(58) Field of Classification Search
CPC .................................................. G01R 31/389
USPC ......................................................... 702/63
See application file for complete search history.

(56) References Cited

U.S. PATENT DOCUMENTS

| 2014/0218042 A1* | 8/2014 | Koba ................... G01R 31/389 324/430 |
| 2014/0229130 A1* | 8/2014 | Koba .................... H01M 10/48 702/63 |
| 2015/0303533 A1 | 10/2015 | Osaka et al. |
| 2016/0240898 A1* | 8/2016 | Koba .................... H01M 10/54 |
| 2018/0156872 A1* | 6/2018 | Oguma ................ G01R 31/389 |
| 2018/0222344 A1* | 8/2018 | Oguma ................ G01R 31/374 |
| 2018/0275201 A1* | 9/2018 | Oguma ................ G01R 31/389 |

FOREIGN PATENT DOCUMENTS

WO         2014054796 A1    4/2014

* cited by examiner

*Primary Examiner* — Hien D Khuu
(74) *Attorney, Agent, or Firm* — Maschoff Brennan

(57) ABSTRACT

A battery capacity measuring device that measures the battery capacity of a rechargeable battery includes an impedance measurement unit that measures the complex impedance of a rechargeable battery, which is a subject to measurement, based on application of measurement AC power, a parameter calculation unit that calculates a parameter that is a ratio of a difference between measured angular speeds of two complex impedances having different measured angular speeds in a diffusion region among a plurality of measured complex impedances to a difference between components of the two complex impedances, and a capacity calculation unit that calculates the capacity of the rechargeable battery based on information that is set in advance and indicates the relationship between the capacity of the rechargeable battery and the parameter and a parameter calculated by the parameter calculation unit.

6 Claims, 3 Drawing Sheets

BATTERY CAPACITY MEASURING DEVICE AND BATTERY CAPACITY MEASURING METHOD

CROSS-REFERENCE TO RELATED APPLICATIONS

This application is based upon and claims the benefit of priority from prior Japanese Patent Applications No. 2016-173725, filed on Sep. 6, 2016, the entire contents of which are incorporated herein by reference.

BACKGROUND ART

The present invention relates to a battery capacity measuring device that measures battery capacity of a rechargeable battery and a battery capacity measuring method for use in the battery capacity measuring device.

Nickel-metal hydride rechargeable batteries and lithium ion rechargeable batteries are used for vehicle-mounted power supplies for use in electric vehicles, hybrid vehicles, or the like, because these rechargeable batteries have high energy density. Such a rechargeable battery is typically configured as an assembled battery including a plurality of battery modules each of which includes a plurality of single batteries.

In rechargeable batteries, the present ratio of the battery capacity to the initial battery capacity is referred to as "capacity retention rate". The capacity retention rate of the rechargeable battery effects the traveling distance of an electric vehicle or the like. It is thus desirable that the capacity retention rate of the rechargeable battery be accurately calculated. International Patent Publication No. WO 2014/054796 describes an example of a battery capacity measuring device that calculates the capacity retention rate with higher accuracy.

The battery capacity measuring device described in International Patent Publication No. WO 2014/054796 includes a rechargeable battery of which degree of deterioration is measured, a memory unit that stores specific information including a measured frequency, a measured temperature, and initial limit capacity of a rechargeable battery having the same specification as the rechargeable battery to be measured, and a temperature measurement unit that measures the temperature of the rechargeable battery. Additionally, the battery capacity measuring device includes a power supply unit that applies an AC signal having a measured frequency of 0.5 mHz or greater and less than 10 mHz to the rechargeable battery having a measured temperature of 40° C. or greater and 70° C. or less based on the information in the memory unit, and a measurement unit that measures the impedance of the rechargeable battery using the AC signal applied by the power supply unit (see region dc of impedance curve L51 in Nyquist plot shown in FIG. 5). The battery capacity measuring device further includes a calculation unit that calculates the degree of deterioration using the limit capacity of the rechargeable battery that is calculated using a measured value obtained by the measurement unit and the initial limit capacity stored in the memory unit.

SUMMARY OF THE INVENTION

The battery capacity measuring device described in International Patent Publication No. WO 2014/054796 is capable of calculating the degree of deterioration that is correlated with the present battery capacity, that is, the capacity retention rate.

The impedance curve L51 in the Nyquist plot typically includes a plurality of regions as a measured frequency changes from a high frequency side to a low frequency side, as shown in FIG. 5. That is, the impedance curve L51 includes "region a" for circuit resistance, "region b" for solution resistance, "region c" for an AC impedance due to reaction resistance, and "diffusion region d" for substantially linear diffusion resistance. For example, the battery capacity measuring device described in International Patent Publication No. WO 2014/054796 measures the degree of deterioration of a rechargeable battery based on a value of an imaginary component in "vertical region dc" nearer to the low frequency side than "line region da" followed by "region c", in "diffusion region d" for substantially linear diffusion resistance. "Line region da" is in the range of predetermined values where the rate of the change amount of an imaginary component to the change amount of a real component approximates "1". In "vertical region dc", the imaginary component changes larger than the real component and a substantial vertical change can be found in the Nyquist plot. The device described in International Patent Publication No. WO 2014/054796 measures the degree of deterioration of a rechargeable battery having a temperature of 40° C. or greater and 70° C. or less, which is higher than a room temperature. Consequently, if this device is used for measuring the battery capacity of a rechargeable battery that is mounted on an electric vehicle or the like and is being used, it is not realistic because the temperature of the rechargeable battery needs to be increased. Such a problem is not limited to rechargeable batteries mounted on electric vehicles or the like and also arises in rechargeable batteries for various types of apparatuses.

One aspect of the present invention is a battery capacity measuring device that measures battery capacity of a rechargeable battery. The battery capacity measuring device includes an impedance measurement unit, a parameter calculation unit, and a capacity calculation unit. The impedance measurement unit measures complex impedance of a rechargeable battery, which is subject to measurement, based on application of measurement AC power. The parameter calculation unit calculates a parameter that is a ratio of a difference between measured angular speeds of two complex impedances having different measured angular speeds in a diffusion region among a plurality of measured complex impedances to a difference between components of the two complex impedances. The capacity calculation unit calculates capacity of the rechargeable battery based on information that is set in advance and indicates a relationship between the capacity of the rechargeable battery and the parameter and a parameter calculated by the parameter calculation unit.

A further aspect of the present invention is a battery capacity measuring method used by a battery capacity measuring device that measures battery capacity of a rechargeable battery. The battery capacity measuring method includes an impedance measuring step, a parameter calculation step, and a capacity calculation step. The impedance measuring step measures complex impedance of a rechargeable battery, which is subject to measurement, based on application of measurement AC power with an impedance measurement unit. The parameter calculation step calculates a parameter that is a ratio of a difference between measured angular speeds of two complex impedances having different measured angular speeds in a diffusion region among a plurality of measured complex impedances to a difference between imaginary components of the two complex impedances with a parameter calculation unit.

The capacity calculation step calculates capacity of the rechargeable battery based on information that is set in advance and indicates a relationship between the capacity of the rechargeable battery and the parameter and the parameter calculated in the parameter calculation step with a capacity calculation unit.

BRIEF DESCRIPTION OF DRAWINGS

The invention, together with objects and advantages thereof, may best be understood by reference to the following description of the presently preferred embodiments together with the accompanying drawings in which.

DETAILED DESCRIPTION OF THE INVENTION

An embodiment of a power supply apparatus that embodies and includes a battery capacity measuring device and a battery capacity measuring method is described with reference to FIGS. 1 to 5. For example, the battery capacity measuring device and the battery capacity measuring method are used for measuring battery capacity of a battery 10 such as a rechargeable battery mounted on a vehicle. In the present embodiment, the battery 10 is a nickel-metal hydride rechargeable battery.

In nickel-metal hydride rechargeable batteries, the electrical capacity that is the amount of electricity that can be charged in a negative electrode is generally larger than the electrical capacity that is the amount of electricity that can be charged in a positive electrode. That is, the nickel-metal hydride rechargeable battery is adjusted to achieve so-called positive electrode regulation. Consequently, if there is no capacity displacement in the nickel-metal hydride rechargeable battery, the battery electrical capacity that is the amount of electricity that can be normally charged in a battery is equal to the positive electrode electrical capacity. In the battery 10, the battery electrical capacity after use, that is, after start of use tends to decrease due to deterioration from the battery electrical capacity in an initial state, that is, when usage starts. The ratio of the battery electrical capacity after use to the initial battery electrical capacity is referred to as "capacity retention rate". The capacity retention rate is calculated based on measured battery electrical capacity of the battery 10. For example, the capacity retention rate is used for calculating SOC (State of Charge) of the battery 10, determining the deterioration of the battery 10, and controlling charging and discharging of the battery 10.

The configuration of a measuring device 30 serving as a battery capacity measuring device for measuring the battery electrical capacity and capacity retention rate of the battery 10 will now be described with reference to FIG. 1

Figure 1:
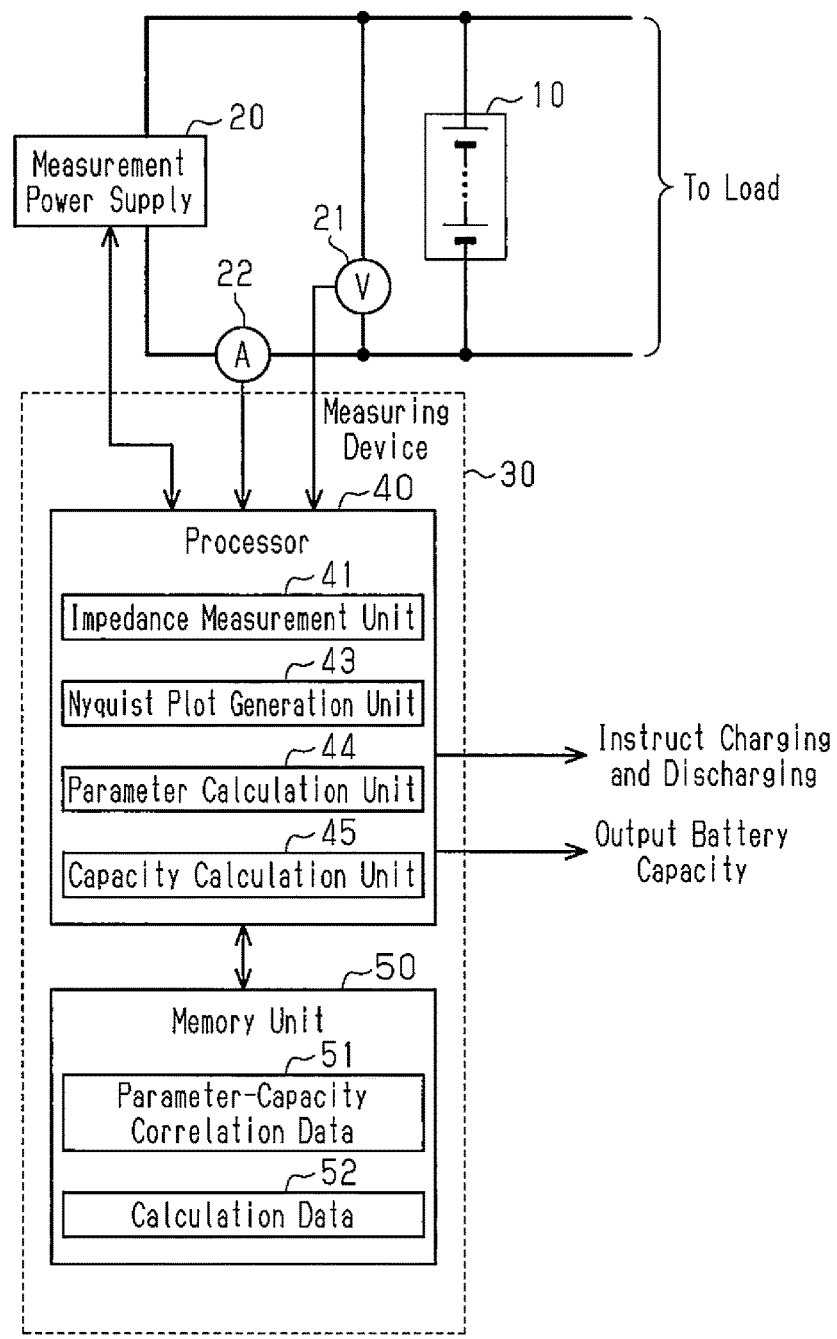
FIG. 1 is a block diagram of a schematic configuration of a battery capacity measuring device according to one embodiment.

As shown in FIG. 1, the battery 10 of which battery electrical capacity is measured is connected via a switch (not shown) to a load, a charger, or the like. When the switch is closed to connect the battery 10 to the load or the like, the battery 10 is charged or discharged and thus the amount of charge in the battery 10 changes. When the complex impedance is measured, the switch is opened to disconnect the battery 10 from the load or the like.

A measurement power supply 20 that supplies AC current, which is AC power, to the battery 10, a voltage measuring device 21 that measures the voltage across electrodes of the battery 10, and a current measuring device 22 that measures current flowing between the measurement power supply 20 and the battery 10 are connected between the electrodes of the battery 10.

The measurement power supply 20 generates AC current having a predetermined frequency and supplies the generated AC current between the electrodes of the battery 10. The measurement power supply 20 can change the measured frequency of AC current. Output current and the frequency range of the measured frequency are set in the measurement power supply 20, and the AC current, which is the output current, is supplied at a measured frequency changing within the frequency range. For example, the set frequency range is from 100 kHz, which is at a high frequency side, to 1 mHz, which is at the low frequency side. The frequency range is not limited to this range, and the high frequency side may be higher than 100 kHz and the low frequency side may be lower than 1 mHz. Alternatively, the frequency range that targets "line region da" in "diffusion region d" shown in FIG. 5, for example, the range of 0.1 Hz to 0.01 Hz may be set. Moreover, two or greater different frequencies in "diffusion region d", for example, frequencies between 0.1 Hz and 0.01 Hz may be set. As described above, it is known that an angular speed and a frequency satisfy the relationship of "angular speed=$2\pi\times$frequency" and thus, to aid understanding, descriptions are given below using the angular speed and the frequency.

The measurement power supply 20 supplies a set value of the AC current supplied from the measurement power supply 20 and a signal relating to a set value of a measured frequency to the measuring device 30. The measurement power supply 20 switches supply and stop of the AC current according to an output start signal and an output stop signal that are supplied from the measuring device 30.

The voltage measuring device 21 supplies a voltage signal corresponding to measured voltage across the electrodes of the battery 10 to the measuring device 30.

The current measuring device 22 supplies a current signal corresponding to measured current between the measurement power supply 20 and the battery 10 to the measuring device 30.

The measuring device 30 measures the battery electrical capacity and battery capacity retention rate of the battery 10. The measuring device 30 may display or externally output measured battery electrical capacity and battery capacity retention rate of the battery 10. For example, an external battery control device (not shown) may execute charge and discharge control on the battery 10 according to the battery electrical capacity of the battery 10 supplied from the measuring device 30.

The measuring device 30 receives a voltage signal from the voltage measuring device 21, obtains a value of the voltage across terminals of the battery 10 from the received voltage signal, receives a current signal from the current measuring device 22, and obtains a value of the current flowing between the measurement power supply 20 and the battery 10 from the received current signal. The measuring device 30 obtains the output setting and measured frequency of the AC current from a signal received from the measurement power supply 20.

The measuring device 30 further includes a processor 40 that performs a calculation process relating to the measurement of the current battery electrical capacity of the battery 10 and a memory unit 50 that stores information used for the calculation process of the battery electrical capacity of the battery 10.

The memory unit 50 is a non-volatile memory device such as a hard disk or a flash memory, and stores various data. In the present embodiment, the memory unit 50 stores parameter-capacity correlation data 51 required for calculating the battery electrical capacity and capacity, and calculation data 52. The battery electrical capacity of the battery 10 in an initial state and the like is set as the calculation data 52.

The processor 40 includes a microcomputer configured by a CPU, a ROM, a RAM and the like. The processor 40 performs various programs stored in, for example, the ROM and the RAM on the CPU, thus performing various processes in the processor 40. In the present embodiment, the processor 40 performs a process of calculating the battery electrical capacity and a process of calculating the battery capacity retention rate. The processor 40 can use the voltage, current, and measured frequency obtained by the measuring device 30. Further, the processor 40 can transmit and receive data to and from the memory unit 50.

The processor 40 includes an impedance measurement unit 41 that measures the complex impedance Z, a Nyquist plot generation unit 43 that generates a Nyquist plot, a parameter calculation unit 44 that calculates a parameter, and a capacity calculation unit 45 that calculates the battery electrical capacity and the battery capacity retention rate.

The impedance measurement unit 41 performs a process of measuring the complex impedance Z of the battery 10 (impedance measuring step). The impedance measurement unit 41 commands the measurement power supply 20 to start or end measurement. The impedance measurement unit 41 measures the complex impedance Z of the battery 10 based on voltage and current obtained from the start of the measurement to the end of the measurement. The unit of the complex impedance Z is [Ω] (ohm). The complex impedance Z is represented by equation (1) using a real component Zr [Ω] and an imaginary component Zi [Ω], which are vector components. Note that "j" is the imaginary unit. The unit [Ω] is omitted hereinafter.

$$Z=Zr-jZi \quad (1)$$

The Nyquist plot generation unit 43 generates a Nyquist plot, based on the complex impedance Z at a plurality of measured frequencies, from real components Zr and imaginary components Zi, which are the vector components of the complex impedance Z.

Figure 2:
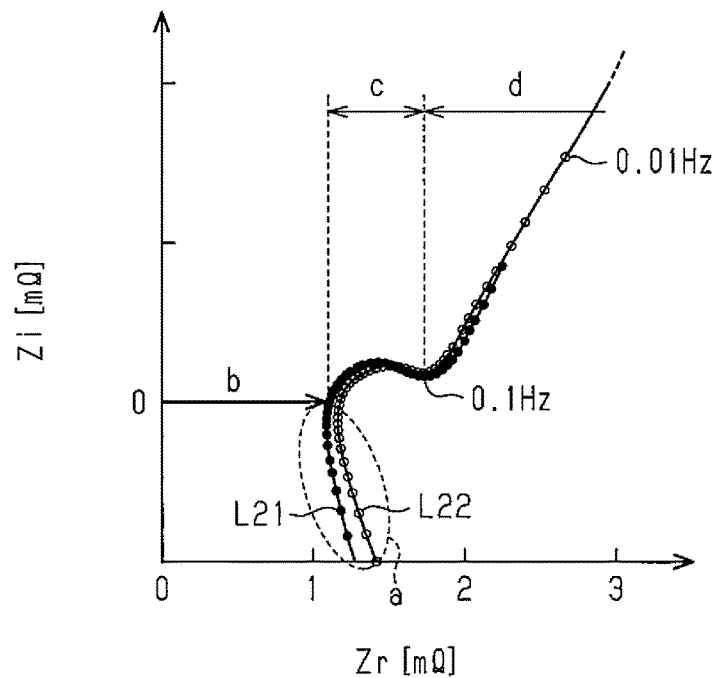
FIG. 2 is a graph showing an example of a Nyquist plot generated from a measured AC impedance of a rechargeable battery in the embodiment.

For example, as shown in FIG. 2, the Nyquist plot generation unit 43 generates impedance curves L21 and L22 as a Nyquist plot on a complex plane where the horizontal axis is a real axis and the vertical axis is an imaginary axis. The impedance curve L21 is an example of the Nyquist plot of the battery 10 in an initial state, and the impedance curve L22 is an example of the Nyquist plot of the battery 10 after use. Each of the impedance curves L21 and L22 is obtained by plotting the magnitude of the real components Zr and the imaginary components Zi of the complex impedance Z on the complex plane. The impedance curves L21 and L22 are based on the complex impedance Z measured by changing the measured frequency of the AC current supplied from the measurement power supply 20 to the battery 10.

In FIG. 2, each dot and circle in the impedance curves L21 and L22 indicates a measured frequency. In FIG. 2, measured frequencies at a lower side are at a high frequency side and measured frequencies at an upper side are at a lower frequency side. The impedance curves L21 and L22 change depending on the SOC or battery temperature of the battery 10. The impedance curves L21 and L22 also change depending on the type of the battery such as a nickel-metal hydride rechargeable battery or a lithium ion rechargeable battery. Even for the same type of the battery, the impedance curves L21 and L22 change when the number of cells, the capacity, or the like is different.

The impedance curves L21 and L22 of the battery 10 are described in detail with reference to FIGS. 2 and 5.

As shown in FIG. 2, the impedance curves L21 and L22 of the battery 10 are divided into a plurality of regions corresponding to characteristics of the battery 10. The regions include "region a", "region b", "region c", and "diffusion region d" in order from the high frequency side to the low frequency side of the measured frequency. "Region a" is a circuit resistance region for circuit resistance, "region b" is a solution resistance region for solution resistance, "region c" is a reaction resistance region for the complex impedance due to reaction resistance, and "diffusion region d" is a region for substantially linear diffusion resistance. The circuit resistance is the impedance of wires formed from an active material, contact resistance in a current collector, and the like. The solution resistance is electron shift resistance such as resistance when ions in an electrolyte solution in a separator move. The reaction resistance is charge transfer resistance in an electrode reaction. The diffusion resistance is an impedance related to mass diffusion. One resistance affects the other resistance and thus it is difficult to divide the regions a, b, c, and d as a region that is only affected by each resistance. However, at least in each of the regions a, b, c, and d in the impedance curves L21 and L22, the schematic behavior of each curve is defined by the most affected resistance component. For example, "region c" is affected greatly by the state of a negative electrode and "diffusion region d" is affected greatly by the state of a positive electrode.

In general, the impedance curves L21 and L22 of the battery 10 are obtained by combining a positive electrode impedance with a negative electrode impedance. For example, in the frequency range for "diffusion region d", the positive electrode impedance changes large but the negative electrode impedance changes small. That is, it is found that "diffusion region d" of the impedance curves L21 and L22 is affected greatly by the positive electrode impedance and reflects the state of the positive electrode. In contrast, in the frequency range for "region c", the negative electrode impedance changes large but the positive electrode impedance changes small. That is, it is found that "region c" of the impedance curves L21 and L22 is affected greatly by the negative electrode impedance and reflects the state of the negative electrode.

In the impedance curves L21 and L22, the frequency range for "diffusion region d" is "0.1 Hz" or less and FIG. 2 shows "diffusion region d" in the range of "0.1 Hz" to "0.01 Hz". The frequency range for "region c" is larger than "0.1 Hz" and "100 Hz" or less. The frequency range for "region b" is "100 Hz" and around "100 Hz". The frequency range for "region a" is larger than "100 Hz". As long as "diffusion region d" is in the frequency range less than that of "region c", "diffusion region d" may be larger than or less than the range of "0.1 Hz" or less.

Figure 5:
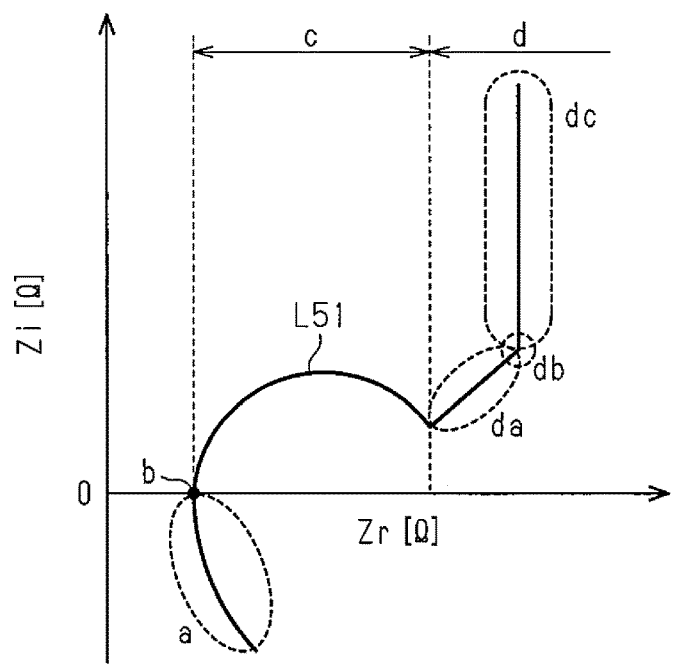
FIG. 5 shows an example of a Nyquist plot generated from a measured AC impedance of a battery.

As shown in FIG. 5, "diffusion region d" includes "line region da", "vertical region dc", and "region db". "Line region da" is in the range of predetermined values where the rate of the change amount of an imaginary component to the change amount of a real component approximates "1". That is, "line region da" corresponds to the range having an angle of nearly 45° in FIG. 5, in other words, the range in which the absolute value of the change rate of the imaginary component of the complex impedance to the real component of the complex impedance is 0.5 or greater and 2 or less. The imaginary component is thus correlated with the real component in "line region da". In "vertical region dc", only the imaginary component changes large with respect to the real component and thus the graph changes substantially vertically in FIG. 5. That is, "vertical region dc" corresponds to the range having an angle of nearly 90° in FIG. 5. "Region db" includes the boundary between "line region da" and "vertical region dc" and a region around the boundary.

In the battery 10, the measurement of the complex impedance generally ends with "line region da" because of characteristics of a nickel-metal hydride rechargeable battery and practical use of measured values. A measured frequency at which "vertical region dc" is generated in a nickel-metal hydride rechargeable battery tends to be lower than a frequency at which "vertical region dc" is generated in a lithium ion rechargeable battery. To measure "vertical region dc" of the battery 10 more accurately, it is necessary to prepare the measurement environment, for example, to increase the temperature of the battery, and to set a measured frequency to a frequency which is much lower than "0.01 Hz" and which requires time to be measured. It is impossible to know in advance the measured frequency at which "vertical region dc" is generated, and thus the waste time required for measurement may be long. It is difficult to presume the time required for measurement when measuring values of "vertical region dc", and thus measuring the values of "vertical region dc" in the battery 10 that is being used in a vehicle or the like is not realistic.

The parameter calculation unit 44 shown in FIG. 1 calculates the ratio of the difference between measured angular speeds of two complex impedances having different measured frequencies in "diffusion region d" to the difference between imaginary components of the two complex impedances (parameter calculation step). Two complex impedances are represented by "Z1" and "Z2", the imaginary component of the complex impedance "Z1" is represented by "Zi1", the measured frequency of the complex impedance "Z1" is represented by "f1", the imaginary component of the complex impedance "Z2" is represented by "Zi2", and the measured frequency of the complex impedance "Z2" is represented by "f2".

Specifically, the parameter calculation unit 44 calculates the difference (change amount) "Δω=2π×(f1−f2)" between measured angular speeds of two complex impedances "Z1" and "Z2" of the battery 10 and the difference (change amount) "ΔZi=Zi1−Zi2" between the imaginary components of the two complex impedances of the battery 10.

Figure 3:
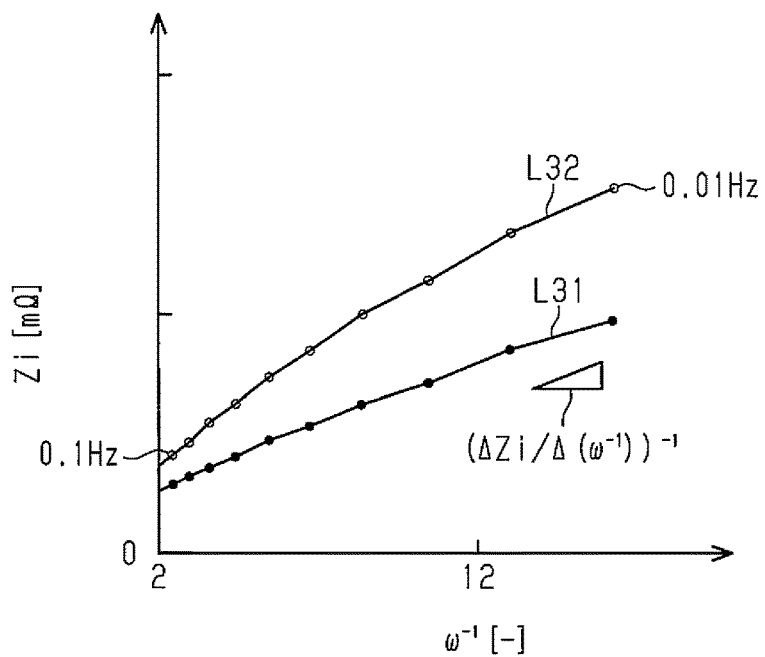
FIG. 3 is a graph showing an example of the relationship between a reciprocal of a measured angular speed of an AC impedance and an imaginary component in the embodiment.

As shown in FIG. 3, a parameter "$Q_D$" is calculated based on the difference "$\Delta(\omega^{-1})$" between reciprocals of the measured angular speeds of the two complex impedances and the difference "ΔZi" between the imaginary components of the two complex impedances. The parameter "$Q_D$" is theoretically calculated using equation (2). Equation (2) represents that the reciprocal of the ratio of "ΔZi" to "$\Delta(\omega^{-1})$" is the parameter "$Q_D$". The parameter "$Q_D$" is preferably calculated as a positive value and thus "$\Delta(\omega^{-1})$" and "ΔZi" may be absolute values, if needed.

$$Q_D = \left[\frac{\Delta Zi}{\Delta(\omega^{-1})}\right]^{-1} \quad (2)$$

While the parameter "$Q_D$" is theoretically calculated using equation (2) as described above, the parameter "$Q_D$" may be calculated based on equation (3) obtained by transforming equation (2). For example, the parameter calculation unit 44 is set to calculate the parameter using an equation on the right side of equation (3). That is, equation (3) indicates that the ratio of the difference "$\Delta(\omega^{-1})$" between the measured angular speeds of two complex impedances having different measured frequencies to the difference "ΔZi" between the imaginary components of the two complex impedances is the parameter "$Q_D$".

$$Q_D = \left[\frac{\Delta Zi}{\Delta(\omega^{-1})}\right]^{-1} = \frac{\Delta(\omega^{-1})}{\Delta Zi} \quad (3)$$

The capacity calculation unit 45 calculates the battery electrical capacity of the battery 10 based on the parameter-capacity correlation data 51, which is information set in the memory unit 50 in advance, and the parameter "$Q_D$" calculated by the parameter calculation unit 44 (capacity calculation step).

The parameter-capacity correlation data 51 is described with reference to FIG. 4. The parameter-capacity correlation data 51 is information that indicates the relationship between the parameter "$Q_D$" for the complex impedance Z of the battery 10 in "diffusion region d" and the battery electrical capacity of the battery 10.

Figure 4:
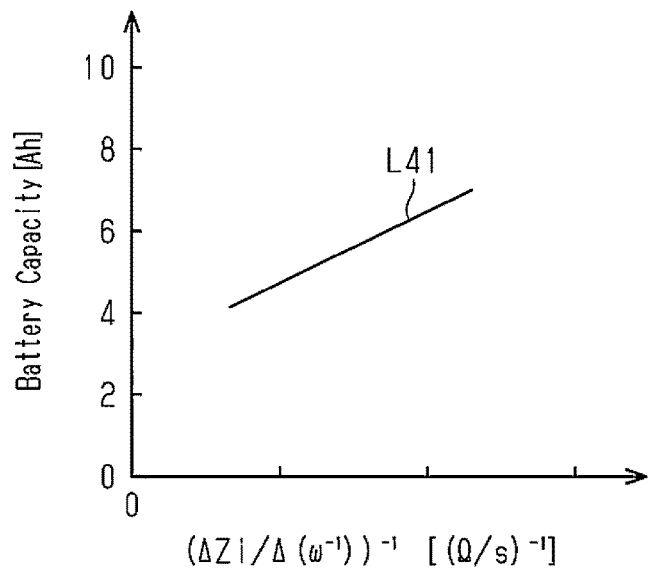
FIG. 4 is a graph showing the relationship between a parameter, which is the ratio of the measured angular speed of the AC impedance to the imaginary component, and battery electrical capacity in the embodiment.

FIG. 4 shows a graph L41, which is a calibration curve, showing an example of the parameter-capacity correlation data 51. Specifically, the graph L41 shows the relationship between the parameter "$Q_D$" ($=(\Delta Zi/\Delta(\omega^{-1}))^{-1}$) and the battery electrical capacity [Ah] of the battery 10. The graph L41 is generated from measured complex impedance of the battery 10 that is manufactured with the same specification as the battery 10, which is subject to measurement, and the battery electrical capacity at that complex impedance. The graph L41 may be generated using measured values or by mixing measured values with theories and experiences. The graph L41 may also be generated from information based on theories and experiences. The graph L41 changes with temperature, and thus may be set for every predetermined temperature. If the graph L41 is prepared for every predetermined temperature, it is possible to more appropriately calculate and measure the capacity of a rechargeable battery.

That is, the parameter-capacity correlation data 51 stored in the memory unit 50 shown in FIG. 1 is information that is set in the memory unit 50 in advance, that is, information that indicates the relationship between the parameter "$Q_D$" relating to the complex impedance Z in "diffusion region d" for the complex impedance of the battery 10 and the battery electrical capacity of the battery 10.

The reason that the battery electrical capacity can be calculated from the parameter "$Q_D$" relating to the complex impedance in "diffusion region d" for the complex impedance of the battery 10 in the present embodiment will now be described with reference to FIGS. 2 to 4.

When the battery 10 is used as a power supply for a vehicle, it is necessary to accurately calculate the SOC of the battery 10. It is more preferable to calculate the SOC including the influence of the deterioration of the battery 10. In the technique described in International Patent Publication No. WO 2014/054796, the degree of deterioration of a rechargeable battery is measured based on a value of an imaginary component in "vertical region dc", which is on the low frequency side in "diffusion region d". At this time, "vertical region dc" is generated by managing the temperature of the battery to be 40° C. or greater and 70° C. or less, but it is difficult to perform such temperature management on a battery that is being used. In addition, in International Patent Publication No. WO 2014/054796, it is necessary to set a measured frequency to be less than 10 mHz, preferably less than 3 mHz. However, for such measured frequencies, the measurement takes "approximately 1.7 minutes" at 10 mHz or "approximately 5.6 minutes" at 3 mHz. Consequently, it is not appropriate for the measurement of the battery 10 with changing SOC, which is being used.

The present inventors have found a technique according to the present embodiment by diligently studying the method of calculating battery electrical capacity that is less affected by the temperature of a battery. This technique uses the difference between two complex impedances to reduce an influence by the temperature of a battery. With this technique, the region for calculating a capacity retention rate does not need to be "vertical region dc" that is difficult to be generated in lithium ion rechargeable batteries and is more difficult to be generated in nickel-metal hydride rechargeable batteries. This enables the time required for measurement to be shorter than a practical time for application to vehicles, for example, "approximately 1.7 minutes".

As described above, FIG. 2 shows an example of the Nyquist plot of the impedance curve L21 for the battery 10 in an initial state and an example of the Nyquist plot of the impedance curve L22 for the battery 10 after use. The state of after use is, for example, a state after 1000 cycles of charging and discharging are repeatedly performed on the battery 10 in an initial state at 45° C. in the SOC range of 40% to 80%.

Comparing the impedance curve L21 to the impedance curve L22, for the impedance curve L22, the change amount of the imaginary component Zi with respect to the real component Zr in "diffusion region d" is smaller and the gradient of the graph is also smaller than those of the impedance curve L21.

FIG. 3 shows graphs L31 and L32 showing the relationship between the reciprocal "$\omega^{-1}$" of a measured angular speed and the imaginary component "Zi" of the complex impedance in "diffusion region d". The graph L31 is for the battery 10 in an initial state and the graph L32 is for the battery 10 after use. The change amount "$\Delta Zi/\Delta(\omega^{-1})$" of the imaginary component Zi with respect to the reciprocal "$\omega^{-1}$" of a measured angular speed in the graph L32 and the gradient of the graph L32 are larger than those of the graph L31. Consequently, for the parameter "$Q_D$", which is obtained as the reciprocal of the change amount "$\Delta Zi/\Delta(\omega^{-1})$", the parameter of the graph L32 is smaller than the parameter of the graph L31. That is, the parameter "$Q_D$" of the battery 10 after use is smaller than the parameter "$Q_D$" of the battery 10 in an initial state.

As the relationship between the complex impedance and battery electrical capacity, FIG. 4 shows a graph L41 showing the relationship between the parameter "$Q_D$" (=$(\Delta Zi/\Delta(\omega^{-1}))^{-1}$) and the battery electrical capacity of the battery 10.

A process of calculating a capacity retention rate by the measuring device 30 according to the present embodiment and the operation thereof will now be described.

Information corresponding to the graph L41 shown in FIG. 4 is stored in advance in the memory unit 50 as the parameter-capacity correlation data 51.

The measuring device 30 then measures the complex impedance of the battery 10 in the impedance measurement unit 41. At this time, the range of measured frequencies is set such that "diffusion region d" is generated in a Nyquist plot. For example, it is assumed that two measured frequencies f1 and f2 are in the range of 0.1 Hz to 0.01 Hz. For example, it is assumed that the measured frequency f1>the measured frequency f2.

The Nyquist plot generation unit 43 generates a Nyquist plot based on the complex impedance measured by the impedance measurement unit 41 and the measured frequency at that complex impedance. The Nyquist plot generation unit 43 also identifies "diffusion region d" from the generated Nyquist plot and obtains imaginary components "Zi1" and "Zi2" of the complex impedances respectively corresponding to two measured frequencies "f1" and "f2" included in the identified "diffusion region d".

The parameter calculation unit 44 obtains two measured frequencies "f1" and "f2" and the corresponding imaginary components "Zi1" and "Zi2" of the complex impedances from the Nyquist plot generation unit 43, and calculates the difference between measured angular speeds "$\Delta\omega=2\pi\times(f1-f2)$" and the difference between the imaginary components "$\Delta Zi=Zi1-Zi2$". The parameter calculation unit 44 then applies the reciprocal "$\Delta(\omega^{-1})$" of the calculated difference between the measured angular speeds and the calculated difference "$\Delta Zi$" between the imaginary components to equation (2) or (3) to calculate the parameter "$Q_D$".

The capacity calculation unit 45 obtains the parameter "$Q_D$" calculated by the parameter calculation unit 44 and applies the obtained parameter "$Q_D$" to the graph L41 (information of parameter-capacity correlation data 51) stored in the memory unit 50, thus obtaining battery electrical capacity. If the parameter "$Q_D$" is large, the battery electrical capacity is also large, and if the parameter "$Q_D$" is small, the battery electrical capacity is also small. In this way, the measuring device 30 measures the battery capacity of the battery 10.

In addition, the capacity calculation unit 45 compares the obtained battery electrical capacity to the battery electrical capacity of the battery 10 in an initial state, which is set as the calculation data 52, to calculate a capacity retention rate with respect to the battery electrical capacity in an initial state. For example, the capacity calculation unit 45 calculates the capacity retention rate as "(obtained battery electrical capacity/initial battery electrical capacity)×100" [%]. In this way, the measuring device 30 measures the battery capacity of the battery 10.

The battery capacity measuring device and the battery capacity measuring method of the present embodiment has the advantages described below.

(1) It is possible to calculate the current capacity of a rechargeable battery based on a value of the complex impedance in "diffusion region d". The imaginary component of the complex impedance tends to change large depending on temperature, but the difference between imaginary components of complex impedances in a diffusion region tends to change small depending on temperature. Consequently, it is possible to minimize an influence of the temperature of the battery 10 by using the difference between the imaginary components of complex impedances in "diffusion region d". In addition, information indicating the relationship between the capacity of the battery 10 and the parameter "$Q_D$", a so-called calibration curve, is provided for each temperature. It is thus possible to appropriately calculate and measure the capacity of the battery 10.

In a Nyquist plot, the complex impedance of a nickel-metal hydride rechargeable battery changes linearly according to frequency changes in "diffusion region d" for diffusion resistance, and thus it is easy to obtain the difference between imaginary components of complex impedances. Further, the complex impedance changes linearly, and thus there are less restriction as to a measured frequency when obtaining the difference. In most cases, the frequency range in the diffusion region is 0.1 Hz or less. Consequently, if the range of 0.1 Hz to 0.01 Hz is used for measurement, the measurement is possible within the practical time range of about 10 seconds to 100 seconds.

(2) The reciprocal of the ratio of the difference between imaginary components to the reciprocal of the difference between measured angular speeds is defined as the parameter "$Q_D$". It is thus possible to calculate the capacity of the battery 10 based on the parameter "$Q_D$" and information that is set in advance and indicates the relationship between the capacity of a rechargeable battery and a parameter. The reciprocal of the difference between measured angular speeds is used as the difference between measured angular speeds, and thus it is possible to obtain the parameter "$Q_D$" as a linear parameter or a nearly linear parameter.

(3) Among two complex impedances in "diffusion region d", the complex impedance in "line region da" that is appropriate for calculating the capacity of the battery 10 can be used for the calculation.

(4) In nickel-metal hydride rechargeable batteries, even though the capacity retention rate, which is the ratio of the current chargeable and dischargeable capacity to the capacity in an initial state, decreases, the internal resistance does not increase. It is thus difficult to calculate the capacity based on the internal resistance. However, according to the present embodiment, the capacity is calculated based on a change in the imaginary component of the complex impedance in "diffusion region d", and thus it is possible to appropriately calculate the capacity retention rate even in the nickel-metal hydride rechargeable battery.

It should be apparent to those skilled in the art that the present invention may be embodied in many other specific forms without departing from the spirit or scope of the invention. Particularly, it should be understood that the present invention may be embodied in the following forms.

In the embodiment described above, the battery 10 is a nickel-metal hydride rechargeable battery, the battery 10 is not limited to the nickel-metal hydride rechargeable battery. Other alkaline rechargeable batteries such as nickel-cadmium batteries and rechargeable batteries such as lithium ion rechargeable batteries may be used for the battery 10.

In the embodiment described above, the unit amount of the real axis has the same length as the unit amount of the imaginary axis on a complex plane. However, the present invention is not limited in such a manner, and the unit amount of the real axis may be different from the unit amount of the imaginary axis.

In the embodiment described above, the parameter "$Q_D$" is calculated from equation (2) or (3). However, the present invention is not limited in such a manner, and the expression is not limited to equation (2) or (3) as long as the calculation equation shows the theory represented by equation (2).

In the embodiment described above, two complex impedances are in "line region da" in "diffusion region d". However, the present invention is not limited in such a manner. If the difference between measured angular speeds of two complex impedances and the difference between imaginary components of two complex impedances are obtained, at least one of the two complex impedances may be in "region db" or "vertical region dc" in "diffusion region d".

In the embodiment described above, a parameter is calculated using the ratio of the difference between measured angular speeds of two complex impedances having different measured frequencies to the difference between imaginary components of the two complex impedances. However, the present invention is not limited in such a manner, and when the imaginary component is correlated with the real component, the real component may be used instead of the imaginary component and the parameter may be calculated using the ratio of the difference between measured angular speeds of two complex impedances having different measured frequencies to the difference between real components of the two complex impedances. In this case, if information (a calibration curve) that indicates the relationship between the capacity of a rechargeable battery and a parameter is prepared in advance for the parameter, the battery capacity of the rechargeable battery can also be calculated.

In the embodiment described above, a linear parameter or a nearly linear parameter is obtained by using the reciprocal of the difference between measured angular speeds as the difference between measured angular speeds of two complex impedances. However, the present invention is not limited in such a manner, and the difference between measured angular speeds may be directly used as the difference between measured angular speeds of two complex impedances. Although a parameter that is not linear is obtained, there is the correlation relationship between this parameter and the capacity.

While In the embodiment described above, the battery 10 is mounted on electric vehicles or hybrid vehicles, the present invention is not limited in such a manner, and a rechargeable battery may be mounted on vehicles such as gasoline cars and diesel cars. Alternatively, the rechargeable battery may be used as a power supply for moving bodies such as railways, ships, aircrafts, and robots or as a fixed power supply for electrical products such as information processing devices.

The present examples and embodiments are to be considered as illustrative and not restrictive, and the invention is not to be limited to the details given herein, but may be modified within the scope and equivalence of the appended claims.

The invention claimed is:

1. A battery capacity measuring device that measures battery capacity of a rechargeable battery, the battery capacity measuring device comprising: an impedance measurement unit that measures complex impedance of the rechargeable battery, which is subject to measurement, based on application of measurement AC power; a parameter calculation unit that calculates a parameter that is a ratio of a difference between measured angular speeds of two complex impedances having different measured angular speeds in a diffusion region among a plurality of measured complex impedances to a difference between components of the two complex impedances; and a capacity calculation unit that calculates capacity of the rechargeable battery based on information that is set in advance and indicates a relationship between the capacity of the rechargeable battery and the parameter calculated by the parameter calculation unit.

2. The battery capacity measuring device according to claim 1, wherein the rechargeable battery, which is the measurement subject, is a nickel-metal hydride rechargeable battery, and information that indicates the relationship between the capacity of the rechargeable battery and the parameter is information that indicates a relationship between battery electrical capacity of the nickel-metal hydride rechargeable battery and the parameter.

3. A battery capacity measuring device that measures battery capacity of a rechargeable battery, the battery capacity measuring device comprising: an impedance measurement unit that measures the complex impedance of the rechargeable battery, which is subject to measurement, based on application of measurement AC power; a parameter calculation unit that calculates a parameter that is a ratio of a difference between measured angular speeds of two complex impedances having different measured angular speeds in a diffusion region among a plurality of measured complex impedances to a difference between imaginary components of the two complex impedances; and a capacity calculation unit that calculates capacity of the rechargeable battery based on information that is set in advance and indicates a relationship between the capacity of the rechargeable battery and the parameter calculated by the parameter calculation unit.

4. The battery capacity measuring device according to claim 3, wherein the parameter calculation unit is configured to calculate a ratio of the difference between the measured angular speeds of the two complex impedances to the difference between imaginary components of the two complex impedances based on an equation of $$Q_D = \left[\frac{\Delta Zi}{\Delta(\omega^{-1})}\right]^{-1}$$

where "$\Delta(\omega^{-1})$" is the difference between the measured angular speeds of the two complex impedances, "$\Delta Zi$" is the difference between the imaginary components of the two complex impedances, and "$Q_D$" is the parameter.

5. The battery capacity measuring device according to claim 3, wherein the measured angular speeds of the two complex impedances are within a range in which an absolute value of a change rate of imaginary components to real components of the two complex impedances is 0.5 or greater and 2 or less.

6. A battery capacity measuring method used by a battery capacity measuring device that measures battery capacity of a rechargeable battery, the battery capacity measuring method comprising: an impedance measuring step of measuring complex impedance of the rechargeable battery, which is subject to measurement, based on application of measurement AC power with an impedance measurement unit; a parameter calculation step of calculating a parameter that is a ratio of a difference between measured angular speeds of two complex impedances having different measured angular speeds in a diffusion region among a plurality of measured complex impedances to a difference between imaginary components of the two complex impedances with a parameter calculation unit; and a capacity calculation step of calculating capacity of the rechargeable battery based on information that is set in advance and indicates a relationship between the capacity of the rechargeable battery and the parameter calculated in the parameter calculation step with a capacity calculation unit.

* * * * *